United States Patent [19]

Suzuki et al.

[11] Patent Number: 4,750,497
[45] Date of Patent: Jun. 14, 1988

[54] TEMPERATURE SENSOR

[75] Inventors: Hirosuke Suzuki, Tokorozawa; Satoru Kobayashi, Shimo-Kayama; Yoshiaki Sato, Hidaka, all of Japan

[73] Assignee: Junkosha Co., Ltd., Japan

[21] Appl. No.: 825,796

[22] Filed: Feb. 4, 1986

Related U.S. Application Data

[63] Continuation-in-part of Ser. No. 397,531, Jul. 12, 1982, abandoned.

[30] Foreign Application Priority Data

Sep. 24, 1981 [JP] Japan .................. 56-151848

[51] Int. Cl.[4] .............................................. A61C 5/00
[52] U.S. Cl. ........................................ 128/736; 374/185
[58] Field of Search ................ 128/736, 804; 374/122, 374/132, 183, 185; 338/212

[56] References Cited

U.S. PATENT DOCUMENTS 4,253,469 5/1981 Aslan ...................................... 128/736
4,346,715 8/1982 Gammello .......................... 128/736

OTHER PUBLICATIONS

Bowman, R. R., "A Probe for Measuring Temperature . . . ", IEEE Trans. MTT, Jan. 1976, pp. 43–45.
Larsen, L. E. et al., "A Microwave-Decoupled Brain Temperature Transducer", IEEE Trans. MTT, vol. MTT–22, pp. 438–444, Apr. 1974.
Greene, F. M., "NBS Field Strength Standards and Measurements, (30–1000 MHz), Proc. IEEE, (Special Issue on Radio Measurement Methods and Standards)", vol. 55, pp. 970–981, Jun. 1967.

Primary Examiner—Francis J. Jaworski
Attorney, Agent, or Firm—Mortenson & Uebler

[57] ABSTRACT

A temperature sensor is provided comprising an electrical temperature sensing element such as a thermistor and a pair of high-resistance conductors of conductive fluorocarbon resin which are electrically connected to the electrical temperature sensing element. The conductors of conductive fluorocarbon resin are disposed on opposite surfaces of a body of fluorocarbon resin. The electrical temperature sensing element may be sandwiched between the pair of high-resistance conductors. Alternatively, the temperature sensor comprises a temperature sensing element held in place and in electrical contact between a pair of conductive fluorocarbon sheets, the sheets being fused one to each side of an electrically insulative sheet of fluorocarbon resin, thereby forming a laminated composite in sheet form, the laminate being vertically separated along its longitudinal axis remote from the temperature sensing element, thereby providing a 4-lead temperature sensor. The temperature sensor thus constructed may be used in microwave therapy as it is less subjected to rejection by human body tissues and does not reflect applied microwaves.

1 Claim, 1 Drawing Sheet

TEMPERATURE SENSOR

CROSS-REFERENCE TO RELATED APPLICATION

This application is a continuation-in-part of prior pending application Ser. No. 397,531, filed July 12, 1982, abandoned.

BACKGROUND OF THE INVENTION

The present invention relates to a temperature sensor which is substantially free from erroneous temperature detection and does not reflect electromagnetic waves when placed in electromagnetic waves such as microwaves.

Hyperthermic therapy uses microwaves to heat body tissues up to 41 to 43 degrees Celsius for destroying cancer cells. It is necessary in such therapy to embed a temperature sensor in the body to measure an actual body temperature for effective destruction of cancer cells only. The temperature sensor however tends to undergo microwave heating, and to reflect microwaves, resulting in a lowered therapeutic efficiency.

The present inventors have made studies in an effort to provide a temperature sensor best suited for use with microwave therapy, and have found that the best results can be achieved by using an electrical temperature sensing element having lead members which are as short as possible and made of a high-temperature electrical conductor for picking up an electrical signal proportional to the temperature of the electrical temperature sensing element.

SUMMARY OF THE INVENTION

It is an object of the present invention to provide a temperature sensor which, when placed in electromagnetic waves, will be substantially free from erroneous temperature detecting and reflect no electromagnetic waves.

According to the present invention, a temperature sensor is provided comprising an electrical temperature sensing element and a pair of high-resistance electrical conductors or lead members electrically connected to the electrical temperature sensing element. With this arrangement, the lead members undergo virtually no self-heating due to applied electromagnetic waves, caue no erroneous temperature detection, and reflect no electromagnetic waves. Where the high-resistance electrical conductors are made of conductive fluorocarbon resin, they substantially eliminate self-heating and electromagnetic wave reflections, and will not be rejected by body tissues when embedded in a human body. The conductive fluorocarbon resin may have a core or reinforcement made of resin of elongated porous polytetrafluoroethylene having high tensile strength. In addition, the electrical temperature sensing element may circumferentially be encased in fluorocarbon resin for liquid tight seal, so that adverse effects of body tissues on temperature detection can be avoided, and no physical disorder of body tissue will be caused by the electrical temperature sensing element as embedded therein. Alternatively, the temperature sensor comprises a temperature sensing element held in place and in electrical contact between a pair of conductive fluorocarbon resin sheets, the sheets being fused one to each side of an electrically insulative sheet of a fluorocarbon resin, thereby forming a laminated composite in sheet form, the laminate being vertically separated along its longitudinal axis remote from the temperature sensing element, thereby providing a 4-lead temperature sensor.

The above and other objects, features and advantages of the present invention will become more apparent from the following description when taken in conjunction with the accompanying drawings in which certain preferred embodiments are shown by way of illustrative example.

DETAILED DESCRIPTION OF THE INVENTION AND PREFERRED EMBODIMENTS WITH REFERENCE TO THE DRAWINGS

A temperature sensor is provided comprising an electrical temperature sensing element such as a thermistor and a pair of high-resistance conductors of conductive fluorocarbon resin which are electrically connected to the electrical temperature sensing element. The conductors of conductive fluorocarbon resin are disposed on opposite surfaces of a body of fluorocarbon resin. The electrical temperature sensing element may be sandwiched between the pair of high-resistance conductors. Alternatively, the temperature sensor comprises a temperature sensing element held in place and in electrical contact between a pair of conductive fluorocarbon resin sheets, the sheets being fused one to each side of an electrically insulative sheet of a fluorocarbon resin, thereby forming a laminated composite in sheet form, the laminate being vertically separated along its longitudinal axis remote from the temperature sensing element, thereby providing a 4-lead temperature sensor. The temperature sensor thus constructed may be used in microwave therapy as it is less subjected to rejection by human body tissues and does not reflect applied microwaves.

Figure 1:
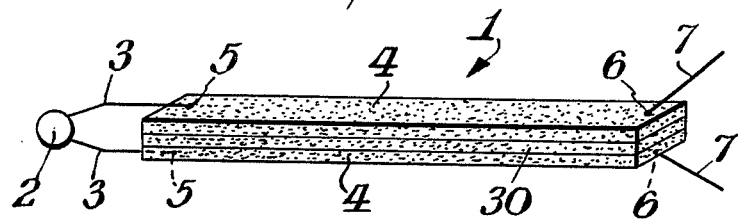
FIG. 1 is a perspective view of a temperature sensor according to an embodiment of the present invention.

As shown in FIG. 1, a temperature sensor 1 comprises a thermistor 2 serving as an electrical temperature sensing element and having metal connectors 3 which are electrically connected by conductive adhesives 5 to high-resistance conductors 4 made of conductive fluorocarbon resin. The conductive adhesives 5 may, for example, be composed of Silver Composition No. 4817 manufactured by E. I. DuPont de Nemours & Co., U.S.A., or DOTITE adhesive manufactured by Fujikura Kasei K.K., Japan.

The high-resistance fluorocarbon resin conductors 4 can be in the form of sheets having a thickness of 0.1 mm and a width of 0.4 mm and thermally fused to both surfaces of a sheet of polytetrafluoroethylene resin 30 having a thickness of 0.2 mm and a width of 0.4 mm. The sheet of polytetrafluoroethylene resin may be fabricated by a method as described in Japanese Patent Publication No. 51-18991, for example. The fluorocarbon resin conductors 4 are also fabricated by substantially the same method, using a conductive filler such as carbon black. Carbon black or other fillers can be used to fill polytetrafluoroethylene resin either by mixing carbon black with a polytetrafluoroethylene resin dispersion and coagulating the mixture, or by mixing carbon black with fine powder of tetrafluoroethylene resin with a mechanical blender.

The carbon black used may comprise KETJEN-BLACK ®EC manufactured by Akzo Chemie GmbH, Netherlands. To form the assembly shown in FIG. 1, a mass of polytetrafluoroethylene resin in which 20% by weight of carbon black is filled is formed into a sheet having a thickness of 0.1 mm. The sheet is thermally fused under pressure to each surface of a separately fabricated sheet of polytetrafluoroethylene resin which is 0.2 mm thick. The three-layer lamination is cut into a piece having a width of 0.4 mm as illustrated in FIG. 1. The conductive fluorocarbon resin body 4 has a length of 300 mm and an electrical resistance of 25 Kiloohms. It is preferable that the length of the conductive fluorocarbon resin body 4 be within a range subjected to electromagnetic waves applied, and the conductors 4 be connected at ends by conductive adhesives 6 to metal lead members 7 for electrical connection to a temperature measuring unit (not shown).

The metal connectors 3 leading from the thermistor 2 should be as short as possible to reduce self-heating and electromagnetic wave reflections. To this end, a thermistor 8 may be sandwiched for electrical connection between a pair of conductive fluorocarbon resin bodies 9, 9 as shown in FIG. 2, fused as shown to unfilled polytetrafluoroethylene sheet 31.

Figure 2:
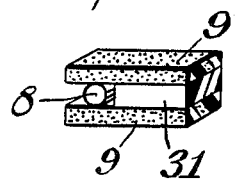
FIG. 2 is a fragmentary perspective view of a temperature sensor according to another embodiment of the present invention.

The thermistor or electrical temperature sensing element of FIG. 2 and the connectors or lead members may be encased for liquid tight seal in a mass of fluorocarbon resin which is less subject to rejection by human bodies, such as polytetrafluoroethylene resin or a copolymer resin of tetrafluoroethyleneperfluoroalkylvinylether. Thus, body liquids are prevented from penetrating into the electrical temperature sensing element and lead members when they are embedded in a human body and are less subject to rejection by the human body.

Figure 3:
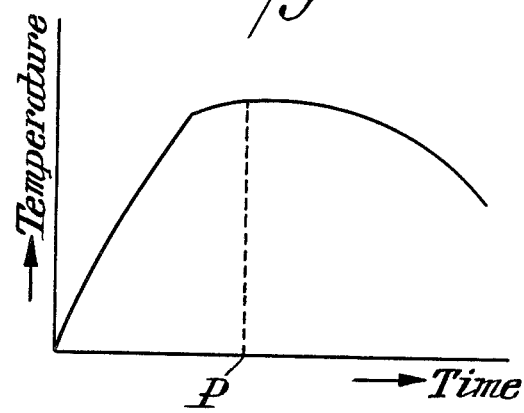
FIG. 3 is a graph showing a temperature vs. time characteristic of a phantom model.

Using a thermistor having a negative temperature coefficient of 5 megaohms at 20 degrees Celsius, a temperature sensor having an outside diameter of 0.9 mm as finished was fabricated. Three such temperature sensors were embedded by a dwelling neelde at depths of 5, 10, 20 mm, respectively, in a phantom model (human body model) which has the same characteristics as those of human body tissues with respect to electromagnetic waves applied. An antenna for radiating electromagnetic waves, having a circular shape of a diameter of 40 mm, was brought into contact with an outer surface of the phantom model, which was irradiated with electromagnetic waves of 10 W to 30 W at a frequency of 2.45 GHz. The phantom model was subjected to a temperature rise as illustrated in FIG. 3. When the radiation of electromagnetic waves was turned off at a time P in the temperature range from 25 to 50 degrees Celsius of the phantom model, the temperatures as indicated by the temperature sensors of the present invention showed no abrupt drop at a resolution of 0.1 degree Celsius. This result confirmed that the temperature sensors of the invention were not adversely affected by electromagnetic waves applied. The lead members are permeable to x-rays.

Figure 4:
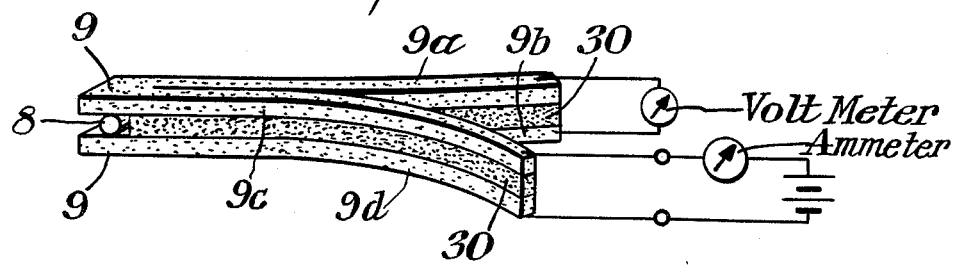
FIG. 4 is a perspective view of a temperature sensor according to the invention in an embodiment having 4-wire flat laminated leads.

FIG. 4 shows an embodiment of the invention wherein a thermistor 8 is held inp lace and in electrical contact between a pair of conductive fluorocarbon resin sheets 9, 9, the sheets being fused one to each side of an electrically insulative sheet 30 of a fluorocarbon resin to form a laminated temperature sensor, the laminate in sheet form being vertically separated along its longitudinal axis and remote from the thermistor 8 to form a 4-lead sensor having leads 9a, 9b, 9c and 9d as shown. The four leads may be connected to electronic devices such as the volt meter and ammeter shown in order to monitor the response of the thermistor 8.

With the arrangement of the invention, the temperature sensor does not cause substantial electromagnetic wave reflections and significant temperature detection errors when placed in electromagnetic waves. The temperature sensor will not be rejected by human body tissues. The temperature sensor of the invention may be used on a microwave oven for temperature detection therein without requiring any special shielding structure. Thus, the temperature sensor of the invention is not limited to medical use, but finds many industrial uses to advantage.

Although certain preferred embodiments have been shown and described in detail, it should be understood that various changes and modifications may be made therein without departing from the scope of the appended claims. For example, a thermocouple or other temperature-sensitive device may be used as an electrical temperature sensing element. Furthermore, a four-terminal arrangement may be employed in which four mutually insulated high-resistance conductors are used as lead members, and two out of the four conductors are utilized for passage therethrough of a current, with the remaining two conductors used for measuring a voltage.

What is claimed is:

1. A temperature sensor comprising an electrical temperature sensing element and at least two high-resistance conductors in sheet form electrically connected to said electrical temperature sensing element , a non-conductive fluorocarbon resin in sheet form being disposed between said conductors , said electrical temperature sensing element being connected to and disposed between said at least two conductors at one end of said assembly adjacent said non-conductive resin sheet , and thereby forming a laminated composite in sheet form, and wherein said laminated composite is vertically separated along its longitudinal axis remote from said temperature sensing element, thereby providing at least a 4-lead temperature sensor.

* * * * *

UNITED STATES PATENT AND TRADEMARK OFFICE
CERTIFICATE OF CORRECTION

PATENT NO. : 4,750,497
DATED : June 14, 1988
INVENTOR(S) : Hirosuke Suzuki, Satoru Kobayashi, Yoshiaki Sato It is certified that error appears in the above-identified patent and that said Letters Patent is hereby corrected as shown below:

In col. 1, line 46, please change "caue" to --cause--.

In col. 2, lines 66-67, please change "fluorocarbonresin" to --fluorocarbon resin--.

In col. 3, line 47, please change "neelde" to --needle--.

In col. 4, line 9, please change "inp lace" to --in place--.

Signed and Sealed this

First Day of November, 1988

*Attest:*

DONALD J. QUIGG

*Attesting Officer*     *Commissioner of Patents and Trademarks*